United States Patent [19]
Loebach et al.

[11] 4,390,273
[45] Jun. 28, 1983

[54] PROJECTION MASK AS WELL AS A METHOD AND APPARATUS FOR THE EMBEDDING THEREOF AND PROJECTION PRINTING SYSTEM

[75] Inventors: Ernst W. Loebach, Eschen; Harry L. Sawatzki, Vaduz, both of Liechtenstein

[73] Assignee: Censor Patent-und Versuchsanstalt, Vaduz, Liechtenstein

[21] Appl. No.: 235,319

[22] Filed: Feb. 17, 1981

[51] Int. Cl.³ .............................................. G03B 27/28
[52] U.S. Cl. ................................. 355/125; 427/259; 428/209; 430/5
[58] Field of Search ................... 355/30, 125, 133, 40; 427/259; 430/5; 428/209, 63

[56]  References Cited

U.S. PATENT DOCUMENTS

| | | | |
|---|---|---|---|
| 3,554,641 | 1/1971 | Jeffee et al. | 355/30 |
| 3,877,810 | 4/1975 | Feldstein | 355/125 |
| 3,893,763 | 7/1975 | Orr | 355/30 X |
| 3,895,147 | 7/1975 | Ahn et al. | 430/5 X |
| 4,049,347 | 9/1977 | Smith, Jr. | 430/5 X |
| 4,063,812 | 12/1977 | Abraham et al. | 355/125 |
| 4,254,174 | 3/1981 | Flanders et al. | 428/209 |

FOREIGN PATENT DOCUMENTS 1270625  4/1972  United Kingdom ............... 355/125

*Primary Examiner*—Richard A. Wintercorn
*Attorney, Agent, or Firm*—Martin A. Farber

[57]  ABSTRACT

A projection mask and method and apparatus for production thereof comprising a substrate carrying a mask thereon, a cover glass covering the pattern mask and sealed at peripheral edges thereof to the substrate defining a space between the substrate with the mask and the cover glass. A particle-free fluid is provided in this space. A projection printing system projects illumination through such a projection mask into a light sensitive substrate.

17 Claims, 9 Drawing Figures

PROJECTION MASK AS WELL AS A METHOD AND APPARATUS FOR THE EMBEDDING THEREOF AND PROJECTION PRINTING SYSTEM

The present invention relates to a projection mask as well as a method and apparatus for the embedding thereof, and a projection printing system.

By U.S. Pat. No. 4,063,812 (Abraham et al.) it is known to provide projection masks for the manufacture of integrated circuits with cover glasses in order to keep unavoidable particles of dust so far away from the plane of the mask itself that they are out of the field of focus and therefore an image of them is not formed.

The production of such projection masks provided with cover glasses has, however, heretofore encountered in practice, insurmountable difficulties. In order to avoid losses of light by partial reflections, the space between the mask, substrate glass and cover glass must be filled with a cement which has approximately the same index of refraction as the glass. As such cement there have been available up to now in particular the Canada balsam used frequently for similar purposes or other synthetically produced cements, for instance cements for optical lenses.

These cements, however, have considerable disadvantages: Canada balsam is still relatively highly viscous even at elevated temperature and can therefore not be easily worked on large areas; it therefore also readily leads to inclusions of air in the edges between mask and substrate glass. Canada balsam is furthermore not always obtainable in the same composition and it is difficult to purify, namely by vacuum distillation. Finally, in case of sudden variations in temperature it tends to become brittle and form microcracks and therefore actually requires continuous inspection.

Synthetically produced cements do not permit, any more than Canada balsam, the removal of the cover glass from the substrate glass and mask in such a manner that the mask is definitely not damaged. Such removal is always necessary when an outer side has become scratched in use and must be coated or renewed in order to be able to continue to use the expensive projection mask. Furthermore, upon the solidification by cooling and/or curing, stresses are only too easily formed which change the system, sufficiently, even though only slightly, for optical inaccuracies to occur which make the projections unusable. Furthermore, stresses can be produced by the fact that substrate glass and cover glass are heated differently and/or have a different coefficient of expansion. Finally, inclusions of air bubbles or particles of contaminants from the working atmosphere cannot be excluded with absolute certainty, although merely a single such particle, which may be only a few $\mu$m in size, may make the entire expensive projection mask valueless.

In order now to eliminate these disadvantages, it is proposed, in accordance with the invention, that a fluid which is liquid or pasty at room temperature be arranged between the substrate glass bearing the mask on the one hand and the cover glass on the other hand, and that the two plates of glass be immovably bonded to each other only at their edge.

It has been found to be particularly suitable for the outside of the cover glass to be provided with an anti-reflection layer, which layer may possibly be electrically conductive. In this way not only are higher light transmittance and thus shorter exposure times obtained, but electrostatic surface charges are removed, which in its turn reduces or even eliminates the adherence of particles of dust that might be large enough to impair the image quality in spite of their being out of focus.

In accordance with another embodiment of the invention, the rear side of the substrate glass which usually has some imperfections and further suffers during the manufacture of the mask is provided with a cover glass, the "attractive" future outer side of which, in contradistinction to the rear side of the substrate glass, can furthermore be coated to reduce reflection, a fluid which is liquid or pasty at room temperature being also arranged in the space between the rear of the substrate glass and the inner side of the second cover glass. This coating may be electrically conductive.

The masking layer is namely customarily applied to the more attractive, i.e. flatter, defect-free surface of the substrate glass; the less flat, defect-free rear side of the substrate glass is subject furthermore even during the application of the masking layer to substantial stressing which leads to damage, even though only microscopically small. Both the irregularities and scratches, etc., are however for all practical purposes made invisible in the manner described by its embedment in a liquid or pasty fluid having an index of refraction corresponding approximately to that of the glass. The same applies to the less attractive rear side (inner side) of the cover glasses, which can be slightly damaged during the application of the anti-reflection and/or conductive layer.

The projection mask of the invention definitely avoids the formation of stresses between substrate glass bearing the mask on the one hand and cover glass on the other hand, such as are practically unavoidable upon a change in temperature or upon curing processes and the solidification of the system resulting therefrom. The liquid of the invention is of such a nature that it is not able to transmit lateral forces. In addition to this, the projection mask can be taken apart very easily and provided with one or two new cover glasses if this should prove necessary in use due to damage to the outer side or sides.

In order now to definitely avoid also the inclusion of contaminating particles into the space between the substrate glass and cover glass, it is proposed, in another embodiment of the invention, that a fluid which is liquid or pasty at room temperature, be caused to circulate, possibly at elevated temperature in the space, widened to the necessary extent, between the substrate glass which bears the masking layer and the cover glass and be pumped for purification, for instance, through a filter whereupon, with constant flow, the two glass plates are brought close to each other, removed from the bath and sealed at their outer edge.

The sealing is facilitated if one of the two glass plates is smaller than the other. This will preferably be the cover glass so that the pattern-bearing surface of the substrate glass remains free as a reference surface in the region of its edge.

As material for the substrate and cover glasses there is generally used a borosilicate glass, for instance white crown glass, or a soda-lime glass, which have an index of refraction $n_D$ of 1.52 to 1.53 at the wavelengths of between 400 and 600 nm which enter into consideration for the projection. Sapphire also could be used as the substrate and cover glasses or other suitable materials. Similarly, quartz glass or other suitable materials may be used for wavelengths below 400 nm.

The fluid between the two glass plates must in principle satisfy the following additional requirements, in addition to the property in accordance with the invention of being liquid or pasty at room temperature:

Its index of refraction should lie close to that of the glass used (preferably not differing by more than ±0.2);

It must have a high transmittance and be stable to light of all wavelengths used, preferably to light of above 360 nm;

It must be inert to the glass used, the mask (for instance a 150 nm thick layer of black chrome), and the sealing material as well as to the structural materials of the apparatus within which the method of the invention is carried out;

It must be filterable at operating temperature, i.e, be a sufficiently thin liquid that it can be pressed with useful speed (for instance 5 to 10 liters/minute) through a filter of a pore size of 0.1–0.3 μm (for instance a folded filter of polyamide fabric with supporting insert) and of reasonable filter surface (for instance 0.75 m$^2$) with ordinary pressure (for instance house-connection 6 bar).

As operating temperature about 60° to about 90° C. has been found to be particularly suitable. The fluid should, of course, have a relatively low vapor pressure at this operating temperature and have a low surface tension both with respect to the glass used and to the mask layer in order to facilitate wetting and prevent the inclusion of air bubbles.

It will be a simple manner for the man skilled in the art to select liquids which satisfy these requirements from the large number of organic liquids available. These include various liquids which have become known from immersion microscopy. A large number of halogenated aliphatics or aromatics enter into consideration, as well as nitrogen-containing or sulfur-containing compounds, for instance amines, or aliphatic sulfides or thiols; the resistance to light of the desired wavelength should possibly be checked—it can be improved, for instance by mixing with paraffin oil which has an index of refraction of 1.42 to 1.43. The following table gives a few examples:

| Fluid | Melting point °C. | Boiling point °C. | Index of refraction n$_D$ |
|---|---|---|---|
| 1.4-dibromobutane | −16 | 197 | 1.52 |
| 1.1-diiodoethane | — | 180 | 1.67 |
| 1-bromonaphthalene | −6 | 281 | 1.66 |
| 1-bromo,2-iodobenzene | +9 | 257 | 1.66 |
| trimethylene-1.3-disulfide | −51 | 175 | 1.60 |
| butane dithiol | −54 | 195 | 1.53 |
| diphenylmethyl amine | −7 | 293 | 1.62 |
| isopropenylbenzene | −23 | 165 | 1.54 |
| 2.3-dimethylaniline | +2 | 194 | 1.56 |

The question of the attack or corrosion of the structural materials of the apparatus employed (stainless steel, aluminum, polytetrafluorethylene) should also be checked from case to case. It is, of course, advisable if materials which are as non-toxic as possible, i.e. can be worked without special protective measures, can be used, such as, for instance, aliphatic compounds rather than aromatic compounds.

A few requirements are also to be satisfied by the sealing material:

It must not interact with the fluid since otherwise changes in the index of refraction, volume, transparency, etc., may occur;

It must be resistant to the solvents (for instance, isopropyl alcohol) with which the finished projection mask is cleaned;

It must adhere well to the glass used;

It should remain somewhat elastic in order to fix the two plates of glass against each other and thus take over the function of the prior art rigid cement but should nevertheless not permit the production of stresses due to rigidity.

In particular synthetic resin adhesives having a base of ethylene copolymers or of polyamides have been found suitable as such sealing agent, particularly if it is intended to be able to reopen the mask in order to replace the cover glasses. If this can be dispensed with, then silicone rubber is a suitable sealing material; a projection mask sealed with this material can—if the outer side or sides have become damaged in operation—also be made suitably usable again by backing with other cover glasses which are coated on the outside so as to reduce reflection.

The projection mask of the invention as well as the method and apparatus for the embedding thereof are explained in further detail on basis of an example in the drawing.

With the above and other objects and advantages in view, the present invention will become more clearly understood in connection with the detailed description of preferred embodiments, when considered with the accompanying drawings, of which:

Figure 1:
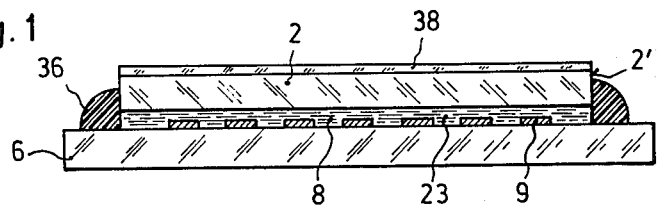
FIG. 1 is a side view of pattern mask of the present invention.

Referring now to FIG. 1, a pattern mask of the present invention comprises a transparent substrate glass 6 (also herein called substrate) having a mask pattern 9 of opaque areas made, for example, of chromium. A cover glass 2 preferably of smaller periphery than that of the substrate 6 (but vice versa can be used) is positioned close to but spaced apart from the substrate glass 6 and sealed to the latter around the peripheral edges 2' of the cover glass with a seal 36. A space 8 thereby is formed between the inner facing surfaces of the cover glass 2 and the substrate 6 as well as the mask 9 in which a particle-free filtered transparent liquid is present. The width of the space is between about 1 and 5 μm.

The liquid has approximately the same index of refraction as the substrate 6 and the cover glass 2. The outer surface of the cover glass may be coated with an anti-reflection coating 38 which also can be electrically conductive or an electrically conductive layer alone.

Figure 1A:
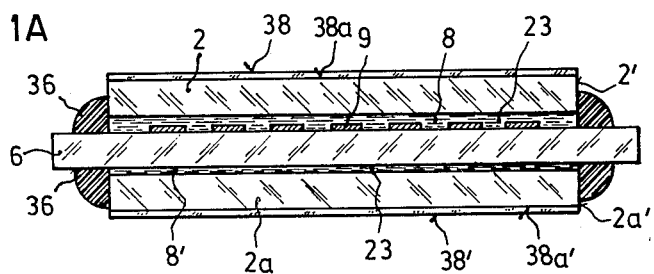
FIG. 1A is a side view of another embodiment of a pattern mask according to the present invention.
Figure 1B:
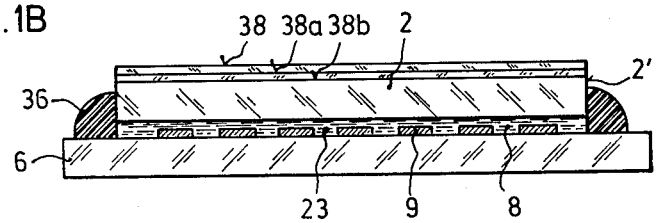
FIG. 1B is a side view of another embodiment of a pattern mask according to the present invention.

In the embodiment of FIG. 1A, which is in part the same as explained above for the parts having identical numerals, another cover glass 2a can be mounted on the other, rear side of the substrate 6 in the same manner as the cover glass 2, likewise with interior space 8' therebetween in which the liquid 23 is enclosed and sealed at the peripheral edges 2a' with the sealant 36. The outer surface of the cover glass 2a also may be coated with an anti-reflecting coating 38', which also can be electrically conductive or an electrically conductive layer may be applied. It should be noted that either or both of the coatings 38, 38' may be anti-reflecting only, or electrically conductive only, or both at the same time, or there may be an electrically conductive coating 38a (FIG. 1B) on top of an anti-reflecting coating 38b.

Figure 2:
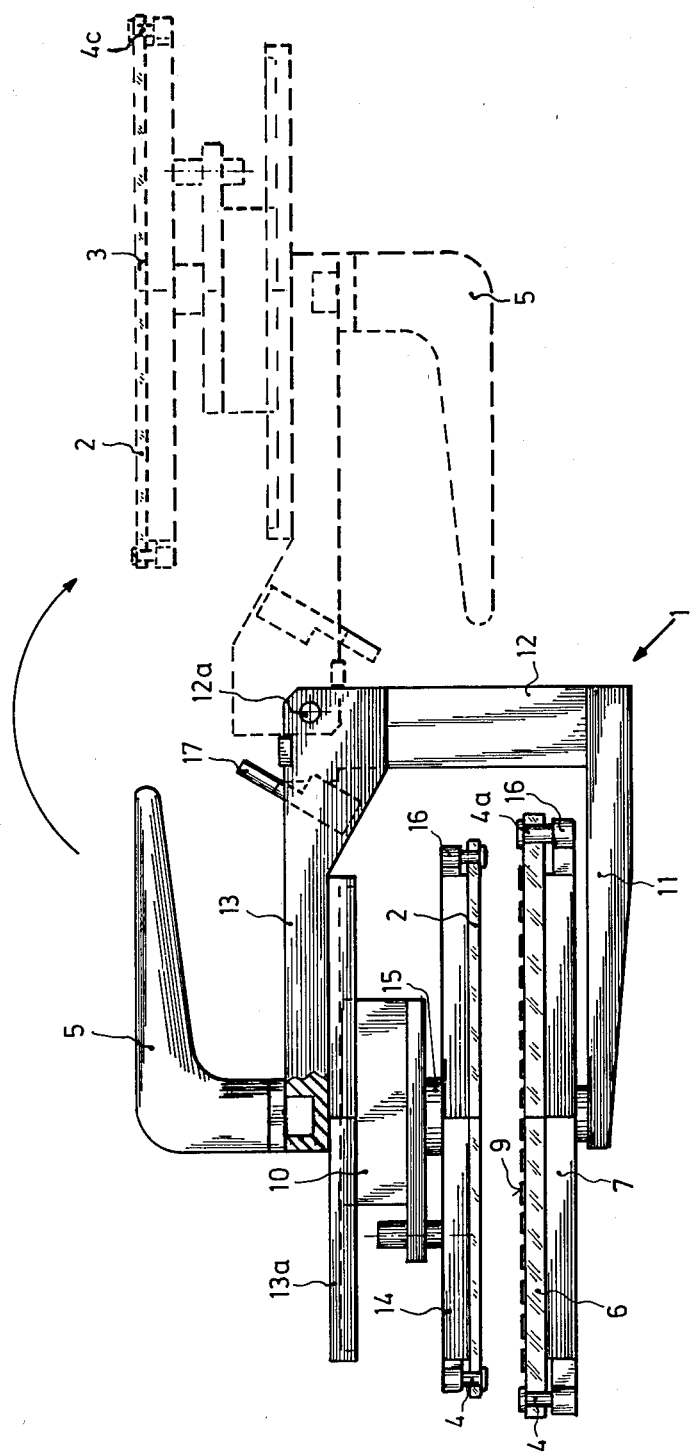
FIG. 2 is a side elevational view of a pressing device portion of the apparatus for manufacturing the pattern mask in accordance with the present invention.
Figure 3:
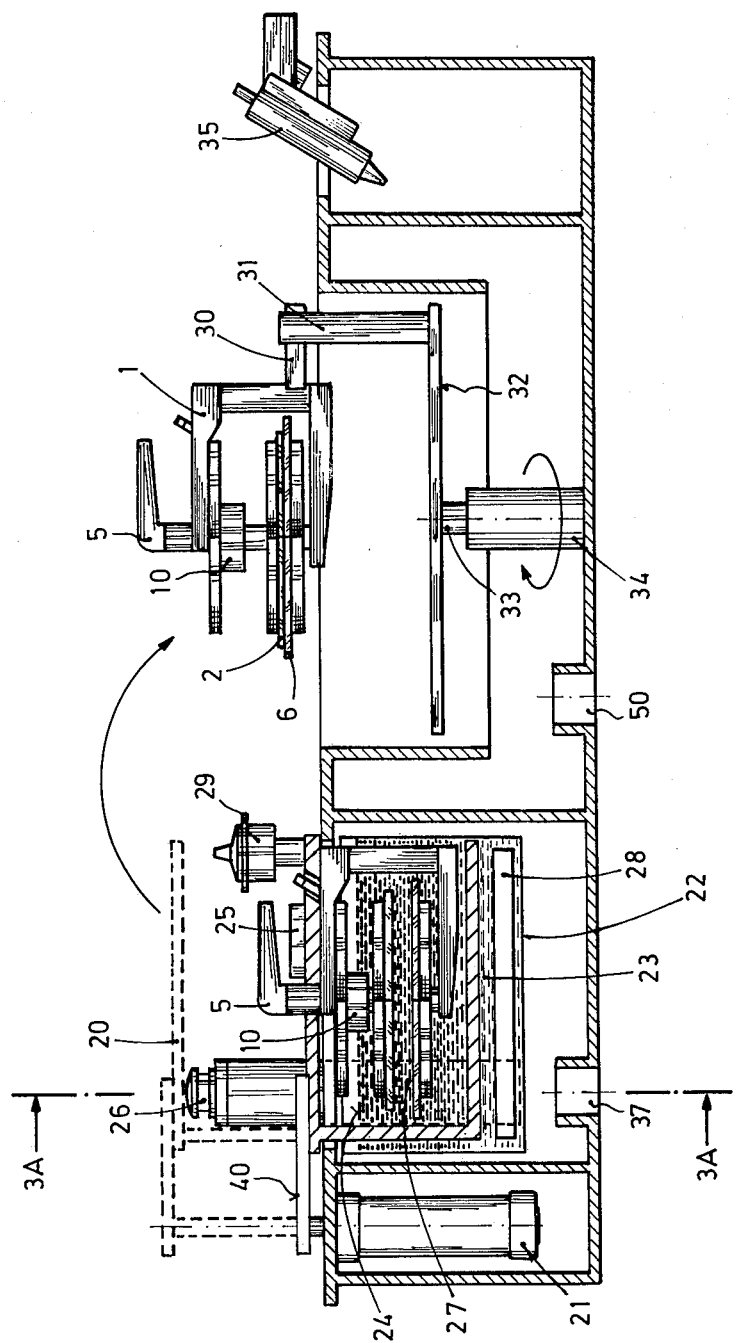
FIG. 3 is a cross-section elevational view of the apparatus for manufacturing the pattern mask.
Figure 4:
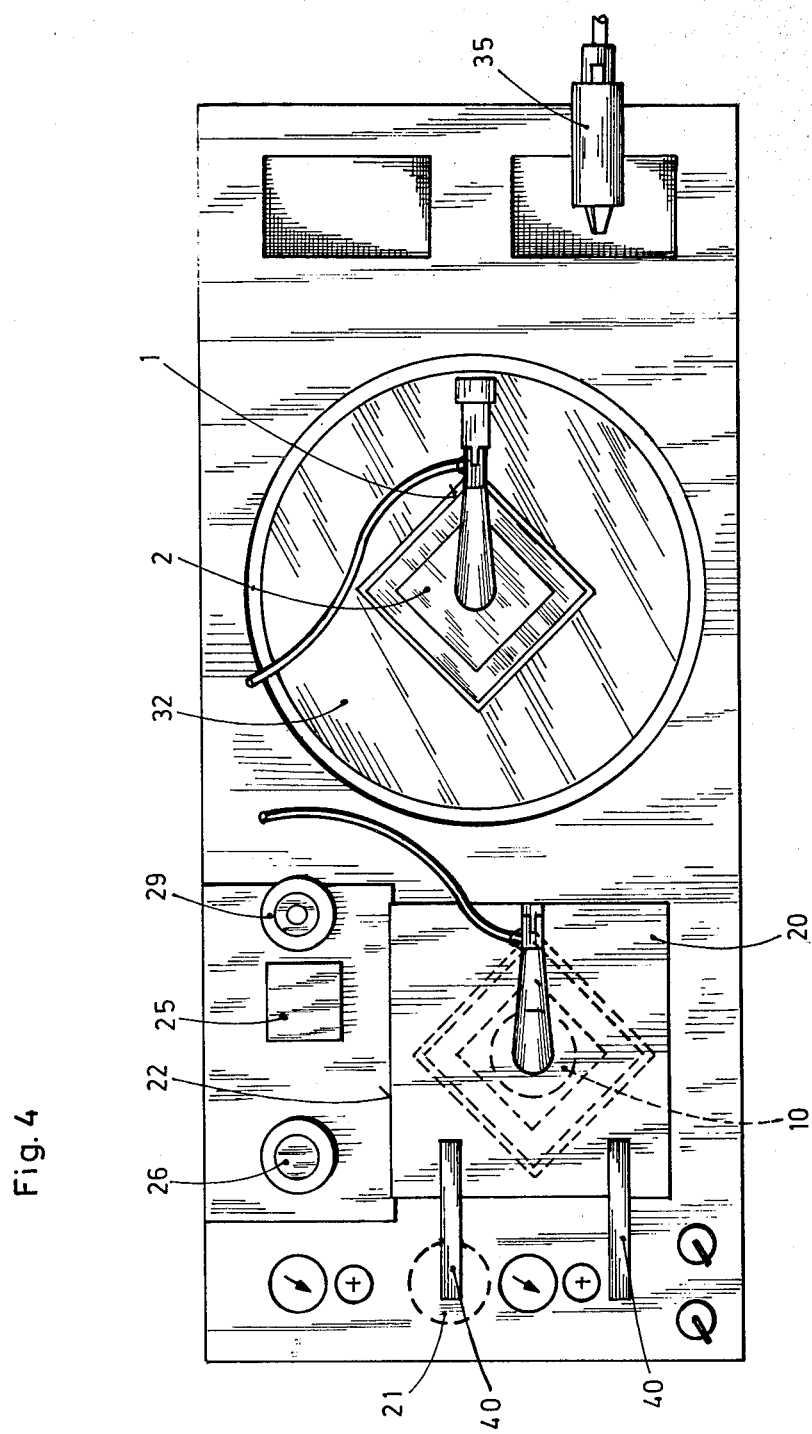
FIG. 4 is a top plan view of the apparatus of FIG. 3.

For the manufacture of the pattern mask of the present invention reference is now made to the apparatus of FIGS. 2-4. A pressing device 1 comprises a bottom pressure plate 7 secured to a bottom arm 11 which is mounted on a vertical post 12. A moveable arm 13 connected to a handle 5 is pivotally connected to the post 12 about a pivot axis 12a and can be locked by a bridge lock 17 in a position above the bottom arm 11 or in a swung out position (dashed lines in FIG. 2) for mounting on or removal, respectively, of a cover glass 2 or finished pattern mask. A pneumatic pressing cylinder 10 is mounted on the arm 13 via an intermediate plate 13a and has a piston 15 connected to an upper pressure plate 14. The pressure plates 7 and 14 are equipped with swingable lock and clamp mounts 16 with clamps 4 for releasably holding a substrate or cover glass on the surfaces of the pressure plates. The pressure utilized in the hydraulic cylinder is 2 bar, corresponding to about 0.2 bar (average) on the pressure plate if the glass plate dimensions are 140×140 mm. Neither the final pressure nor the space are controlled separately.

The cover glass 2 is clamped firmly by the clamps 4 onto the clamping surface 3 of the pressing device 1 which has been swung open (as illustrated in the right side of FIG. 2 in dashed lines). A substrate glass 6 is similarly mounted fast via the clamps 4 on the upper clamping surface of the bottom pressure plate 7 with the mask pattern 9 facing upward. Then the swingable part 5, 10, and 13-15 of the press device 1 is brought manually by means of the handle 5 into the position in which the cover glass 2 is arranged spaced above the substrate glass 6 (as shown in solid lines in the left side position of FIG. 2).

Figure 3A:
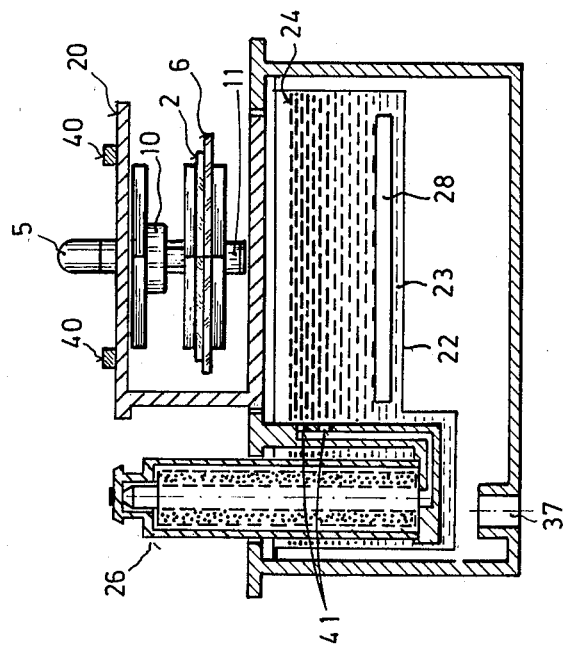
FIGS. 3A and 3B are sections taken along the lines 3A—3A of FIG. 3 and showing the pressing device with the pattern mask in the liquid and lowered and raised out of the liquid, respectively.

The press device 1 is then moved and suspended by hand from a yoke 20, the latter being in its extended position indicated in dashed lines in FIG. 3 (also note FIG. 4). The yoke 20 is mounted on a lift 40 which is connected to a piston of the pneumatic cylinder 21. By actuation of the pneumatic cylinder 21 the press device is lowered into a container 22 (FIGS. 3, 3A). The container contains a liquid 23 filled to a level 24 in the container 22. The liquid 23 is continuously circulated by a pump 25 and forced through a fine-pore filter 26 in order to keep the liquid 23 as free as particles as possible. The drawing-off of the liquid 23 towards the pump 25 takes place in the region of the liquid level 24. The return of the liquid from the filter 26 (which is also carried by and immersed when the yoke was lowered) takes place via lateral nozzles 41 which introduce the fresh or filtered fluid into the space 27 between the cover glass 2 and the substrate glass 6. The fluid 23 is heated by a heater 28 in the container 22 and held at a preselected temperature by a thermostat 29. The suction openings 37, 50 are provided to withdraw any vapor that may develop during the operation. The nozzles 41 are adjacent the peripheral edges of the spaced plates 2,6 (note FIG. 3A).

In one manner of carrying out the process, the liquid is allowed to circulate for some time through the filter 26 and through the space 27 in order to make certain that no particles are present in the liquid between the cover glass 2 and the mask substrate 6. Then by actuation of the pneumatic cylinder 10, the cover plate 2 on the pressing device 1 is lowered toward the substrate glass 6 and are pressed together within the liquid 23 while in the immersed condition, whereby a thin layer of the particle-free liquid is enclosed in the space 8 and even when later the assembly is lifted out of the container 22 the layer of liquid is held by surface tension between the cover glass 2 and the substrate glass 6 which do not contact, the mask likewise not contacting the cover glass 2 except via a wetting layer of a liquid therebetween. The final space left with the layer of liquid between the outer surface of the mask and the inner surface of the cover glass is as small as pressure permits. During this time when lifted out of the container prior to sealing, liquid can not spill out simply due to the capillary effect.

Figure 3B:
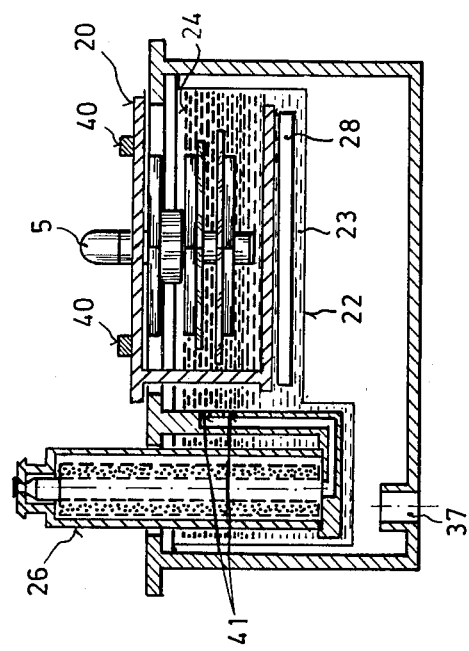

Now by actuation of the cylinder 21 the press device 1 is lifted out of the container 22 via the lift 40 while the cylinder 10 continues to hold the cover glass 2 and the substrate glass pressed together as described above (FIG. 3B). One waits awhile until excess fluid now has dripped back into the container 22 from outer free surfaces. Thereupon, the pressing device 1 is moved to the right hand side position in FIG. 2 (following the curved arrow) by hand by the handle 5 and suspended on a mount 30. The mount 30 is located in the apparatus next to the container 22 and is connected via a support 31 and a rotatable disc-shaped work platform 32 to a shaft 33 which is rotatably mounted in a bushing 34. By rotation of the shaft and platform 32 the peripheral edge region 2' of the cover glass 2 and of the substrate glass 6 becomes readily accessible from all sides.

By means of the dispenser 35 (sealing tool) the peripheral edge gap between the cover glass 2 and the substrate glass 6 is closed and sealed manually by a thermoplastic resin 36. The particle-free fluid 23 in the space 8 cannot escape from the space 8 between the cover glass 2 and the substrate glass 6 and no impurities can penetrate from the outside. By the present invention all significant stresses are avoided. The sealed glasses with the liquid therebetween are not able to transfer lateral force.

A vacuum line (not shown) to draw off any vapors of the fluid which may develop during the sealing is connected to exhaust openings 50 in the working station.

While one pattern mask is in the right-hand side sealing section of the apparatus another pattern mask can be assembled in the liquid container 22.

Figure 5:
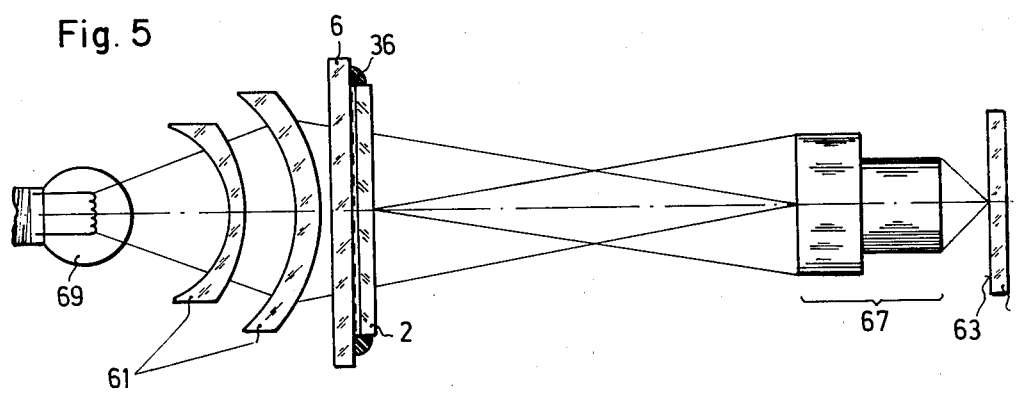
FIG. 5 is a schematic diagram of an optical projection printing system using the pattern mask of the invention.

FIG. 5 illustrates a projection printing system in which a reduced image of a pattern mask of the invention is formed on a photoresist layer 63 on substrate 65 by means of a focussing optical system 67 which is, for example, a refracting projection lens. It should be understood that the pattern mask of the invention could also be used with a system having a 1 to 1 magnification ratio and could employ other focussing optical systems which employ mirrors or a combination of refractive and reflective elements.

A source 69 of illumination is provided, for example a mercury lamp, with suitable filters and shutters (not shown) and a condensor 61.

It is essential for the invention that a liquid be circulated between the plates to remove dust. This is only preferably but not necessarily done while immersed in a container. For example, two opposite edges of the plates can be flexibly sealed during circulation, and two funnels fixed to the two other edges for input and outlet of the fluid.

Herein the term "fluid" excludes gas and solidified liquids, but includes flowable liquids, pastes, jellies, and gelatinous substances. The term "pasty" also as well as paste-like includes a jelly-like or gelatinous substance. The substrate glass and cover glass can be made of glass as well as sapphire or other transparent materials suitable for the purpose intended. That is, whenever the term "glass" is used herein without modification it is to be understood as meaning any plate suitable for the intended purpose.

The fluid must be flowable only during the time of making the mask. In the finished mask, for example, it might be a jelly which no longer is flowable, but is of such a non-solid condition in the finished mask that it does not transmit lateral forces, to the contrary of a solid cement in U.S Pat. No. 4,063,812.

While I have disclosed embodiments of my invention it is to be understood that these embodiments are given by example only and not in a limiting sense.

We claim:

1. A projection mask, comprising
   a substrate glass carrying a mask pattern thereon,
   a cover glass covering said mask pattern and defining a space between said cover glass and said substrate glass carrying said mask pattern, said cover glass being sealed to said substrate glass exclusively at peripheral edges of at least one of said glasses,
   a substantially particle-free transparent non-solid fluid in said space such that lateral forces are not transmittable thereby.

2. A projection mask, comprising
   a substrate glass carrying a mask pattern thereon,
   a cover glass covering said mask pattern and defining a space between said cover glass and said substrate glass carrying said mask pattern, said cover glass being sealed to said substrate glass exclusively at peripheral edges of at least one of said glasses,
   a substantially particle-free transparent non-solid fluid in said space,
   said fluid is selected from the group consisting of a liquid, paste, jelly and gelatinous substance.

3. The projection mask, as set forth in claim 1, wherein
   said fluid is a liquid.

4. The projection mask, as set forth in claim 3, wherein
   said liquid is pasty.

5. The projection mask, as set forth in claim 1 or 2, wherein
   said substrate glass and said cover glass are immoveably bonded to each other only at said peripheral edges.

6. The projection mask, as set forth in claim 1, further comprising
   a coating on an outer side of said cover glass.

7. The projection mask, as set forth in claim 1, wherein
   said mask pattern is on one side of said substrate glass, another cover glass is disposed facing the other side of said substrate glass and sealed at peripheral edges defining a space therebetween,
   said fluid fills said space between said another cover glass and said substrate glass.

8. The projection mask, as set forth in claim 7, further comprising
   a coating on an outer side of said another cover glass.

9. The projection mask, as set forth in claims 6 or 8, wherein
   said coating is electrically conductive.

10. The projection mask, as set forth in claims 6 or 8, wherein
    said coating is anti-reflecting.

11. The projection mask, as set forth in claim 9, wherein
    said coating is also anti-reflecting.

12. The projection mask, as set forth in claim 10, further comprising
    another electrically conductive coating on top of said first-mentioned anti-reflecting coating.

13. The projection mask, as set forth in claim 1 or 2, wherein
    at least one of said glasses being smaller than the other.

14. The projection mask, as set forth in claims 1 or 2, wherein
    said glasses are made of sapphire.

15. An apparatus for manufacture of a projection mask, comprising
    a pressing means having two relatively moveable parts for releasably holding a cover glass on one of said parts and a substrate glass with a mask thereon on the other of said parts spaced apart from one another,
    circulation means including a pump, a filter and nozzles for circulating a liquid through the space between said cover glass and said substrate glass and through said filter and via said nozzles into said space,
    said pressing means including means for pressing said substrate glass and said cover glass close together to form a reduced space between said glasses.

16. A projection printing system for forming an image on a light sensitive substrate, which system includes a substrate glass carrying on one side a projection mask having a pattern of opaque and transparent areas and means to prevent damage and contamination to said substrate glass, comprising
    an illuminating system for directing light through the mask to the light sensitive substrate, and
    an optical means for forming a focused image of the pattern on the light sensitive substrate,
    said means to prevent damage and contamination to said pattern including at least one cover glass covering said substrate glass spaced therefrom and enclosing a substantially particle-free transparent fluid therebetween.

17. A method for protecting a pattern on a substrate glass, comprising the steps of
    holding a cover glass spaced apart from the pattern on the substrate glass in a liquid,
    circulating and filtering the liquid passing through the space between said substrate glass and said cover glass,
    pressing said substrate glass close to said pattern,
    sealing peripheral edges of at least one of said glasses to the other of said glasses, the liquid being enclosed between said pattern and said glasses.

* * * * *